(12) United States Patent
Hurwitz et al.

(10) Patent No.: US 8,089,315 B2
(45) Date of Patent: *Jan. 3, 2012

(54) PROGRAMMABLE GAIN AMPLIFIER

(75) Inventors: Jonathan Ephriam David Hurwitz, Edinburgh (GB); Adrià Bofill-Petit, Barcelona (ES); Robert K. Henderson, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/869,595

(22) Filed: Aug. 26, 2010

(65) Prior Publication Data

US 2010/0321067 A1 Dec. 23, 2010

Related U.S. Application Data

(63) Continuation of application No. 12/250,450, filed on Oct. 13, 2008, now Pat. No. 7,795,973.

(51) Int. Cl.
*H03F 3/45* (2006.01)

(52) U.S. Cl. .................. 330/254; 330/279; 330/51

(58) Field of Classification Search .................. 330/51, 330/9, 254, 124 R, 295, 103, 279
See application file for complete search history.

(56) References Cited

U.S. PATENT DOCUMENTS

| 5,880,631 A * | 3/1999 | Sahota .................. 330/51 |
| 6,518,839 B2 * | 2/2003 | Gibson et al. .................. 330/51 |

* cited by examiner

*Primary Examiner* — Hieu Nguyen
(74) *Attorney, Agent, or Firm* — Garlick Harrison & Markison; Holly L. Rudnick (57) ABSTRACT

A programmable gain amplifier comprising alternatively selectable parallel circuits in a front end and independently selectable serial amplification circuits in a back end. The front end may include, for example, a plurality of transconductors in parallel and each configured to generate a current proportional to a received voltage. A ratio of the generated current to the received voltage being different for each of the transconductors. The back end is configured to receive an output of a selected member of the parallel circuits and may include a plurality of current or voltage mode amplifiers in series. For example, the back end may include a plurality of current-mode gain stages and switches configured to control which of the current-mode gain stages are used to amplify the output of the front end. The programmable gain amplifier may be used between a signal receiver and an analog to digital converter.

18 Claims, 8 Drawing Sheets

PROGRAMMABLE GAIN AMPLIFIER

CROSS-REFERENCE TO RELATED APPLICATIONS

This application is a Continuation of U.S. patent application Ser. No. 12/250,450 entitled "Programmable Gain Amplifier" filed Oct. 13, 2008, now issued as U.S. Pat. No. 7,795,973 and this application is related to U.S. patent application Ser. No. 12/577,536 "Programmable Gain Amplifier and Transconductance Compensation System" filed Oct. 12, 2009 which is a Continuation-in-part of U.S. patent application Ser. No. 12/250,450, now issued as U.S. Pat. No. 7,795,973. This application is also related to U.S. patent application Ser. No. 11/467,141 entitled "Multi-Wideband Communications over Power Lines" filed Sep. 28, 2006, now issued as U.S. Pat. No. 7,899,436; U.S. patent application Ser. No. 12/075,888 entitled "Coupling Signal Processing Circuitry with a Wireline Communication Medium" filed Mar. 14, 2008; and U.S. patent application Ser. No. 11/752,887 entitled "Multi-Wideband Communications over Multiple Mediums" Filed May 23, 2007. The disclosures of the above patent applications are incorporated herein by reference.

BACKGROUND

1. Field of the Invention

The invention is in the field of electronics and more specifically in the field of programmable amplification.

2. Related Art

The receipt of signals in communication systems often includes amplification of analog signals and conversion of these signals to digital values using an analog to digital converter. The amplitude of the received signal may be dependent on the signal's strength at its source, the distance and path traveled, and the efficiency of detection of the signal. As a result, the amplitude of received communication signals may vary widely and unpredictably.

A wide variability in signal amplitude may result is loss of information when the signal is converted to digital values at the analog to digital converter. Analog to digital converters typically are configured to convert signals over a set amplitude range to a set number of digital bits. For example, an analog to digital converter may be configured to convert signals between 0 and 5 Volts to an eight bit digital value. In this case the maximum digital value is generated when the signal is at 5 Volts and the minimum digital value (0) is generated when the signal is at 0 Volts. Problems arise when the received signal is between, for example, 0 and 2 Volts or 0 and 10 Volts. In these cases the signal is mismatched to the input range of the analog to digital converter. The best signal to noise is achieved when the signal is matched to the input range of the analog to digital converter.

Because of these problems it is well known to pass the received signal through a programmable gain amplifier. The programmable gain amplifier may be configured to apply a gain larger than one or a gain smaller than one to the signal. For example, a gain greater than one may be used to increase a 0 to 2 Volt signal to 0 to 5 Volts, and a gain less than one may be used to decrease a 0 to 10 Volt signal to 0 to 5 Volts.

There are two general approaches to programmable gain amplifiers. In one approach the programmable gain amplifier includes a single gain stage whose gain can be changed by, for example, changing the value of a resistance or capacitance. In an alternative approach a series of fixed gain stages are used to produce a stepwise variable gain. In this approach switches are used to control which of the gain stages are included in a signal path. By adding or removing gain stages from the signal path different amounts of gain may be achieved. It is possible for a programmable gain amplifier to include both variable and fixed gain stages.

One problem in using a series of gain stages is that any noise introduced by the first gain stage is amplified by later stages. As a result it is preferable to include as much of the total gain of the series in the first gain stage. This first stage must also be able to receive and amplify a wide range of signal amplitudes. Another problem of using a series of gain stages is to maintain linearity of the system. It turns out that to optimize the linearity of the system it is preferable to include as much of the total gain of the series in the last of the gain stages.

These two factors result in a trade-off between linearity and noise for the system. To minimize noise one would prefer to place most of the gain in the first stages but to optimize linearity one would prefer to place most of the gain in the later stages. There is, therefore, a need for improved programmable gain amplifiers.

SUMMARY

Various embodiments of the invention comprise a programmable gain amplifier comprising a front end including one or more transconductors and a back end including one or more current-mode gain stages. Each of the front end and the back end are separately programmable so as to control gain and other operating characteristics of the programmable gain amplifier. For example, gain of the front end may be controlled by alternatively coupling the output of the one or more transconductors to the output of the front end. Gain of the back end may be controlled by including or not including individual members of the one or more current-mode gain stages in the current path.

Transconductors within the front end are optionally in a parallel array wherein the inputs and outputs of each can be coupled to common points. For example, the outputs of each transconductor may be switchably coupled to the same conduction (output or input) point, e.g., coupled through one or more switches such that the coupling can be switched on and off. Each of the transconductors may be configured to receive signals within specific frequency and/or voltage ranges. As such, switches may be used to select which transconductor is within the single path responsive to the characteristics of the signal.

The current-mode gain stages of the back end comprise current amplifiers in series. Members of the current-mode gain stages can be switched in and out of the signal path to select which stages are used to amplify the signal, and thus how much amplification the signal receives.

By using separately variable front and back ends, one of which is configured to convert voltage to current and the other current-to-current, tradeoffs between optimizing signal amplification and minimizing noise may be reduced relative to the prior art. The elements of each stage may be single-ended or differential, and the amplification may result in increase or decrease in magnitude of the signal.

Various embodiments of the invention include a system comprising: a front end comprising a first transconductor configured to receive a voltage and generate a current proportional to the voltage received by the first transconductor, a second transconductor in parallel with the first transconductor and configured to receive a voltage and generate a current proportional to the voltage received by the second transconductor, and a switch configured to create a signal path from an input of the front end to an output of the front end through alternatively the first transconductor or the second transconductor; and a back end comprising a first current-mode gain stage configured to receive current from the front end and to generate a current proportional to the current received from the front end, a second current-mode gain stage in series with the first current-mode gain stage, configured to receive current via the first current-mode gain stage, and configured to generate current proportional to the current received by the second current-mode gain stage, and a switch configured to select whether or not the second current-mode gain stage is included in a signal path from an input of the back end to an output of the back end.

Various embodiments of the invention include a method comprising: receiving a signal; setting a first switch to alternatively create a first signal path through a first but not a second of a plurality of parallel transconductors, or create the first signal path through the second but not the first of the plurality of parallel transconductors; generating a first current proportional to a voltage of the signal by passing the signal through the first signal path; setting a second switch to alternatively create a second signal path through a first and a second of a plurality of serial current-mode gain stages, or create the signal path through the second but not the first of the serial current-mode gain stages; and generating a second current proportional to the first current by passing the signal through the second signal path.

Various embodiments of the invention include a system comprising: a front end comprising alternatively selectable parallel means for receiving a voltage and converting the received voltage to a current; a back end comprising serial means for variably amplifying the current; and control logic configured to control a ratio between the received voltage and the current, and a ratio between the current and the amplified current.

Various embodiments of the invention include a method comprising: receiving a signal; setting a first switch to create a first signal path through one of a plurality of parallel transconductors; generating a first current proportional to a voltage of the signal by passing the signal through the first signal path; setting a second switch to create a second signal path through a first and a second of a plurality of serial current-mode gain stages; and generating a second current proportional to the first current by passing the signal through the second signal path.

DETAILED DESCRIPTION

An improved programmable gain amplifier includes different types of circuits in a front end and a back end. The front end comprises a plurality of transconductors in parallel. Switches are configured to create a signal path selectively through a single one of these transconductors, responsive to the magnitude of a received signal. Each of the transconductors is configured to generate a current proportional to a received signal voltage. The ratio of received voltage to generated current is typically different for each transconductor. Each transconductor may further be configured to receive signals in a different voltage range. For example, one transconductor may be configured to receive signals between 0 and 1 Volts while another of the transconductors is configured to receive signals between 0 and 2 Volts. The plurality of transconductors in the front end allows for the selection and use of a transconductor best configured to receive a particular signal. In various embodiments this allows for amplification of the signal while maximizing the signal to noise ratio at the output of the front end. The front end may be operated in a differential or single-end mode.

The back end comprises a plurality of amplifiers in series. These serial amplifiers are typically configured to operate in current mode (e.g., to amplify a current). Switches are configured to select which members of the plurality of amplifiers are included in a signal path between an input and an output of the back end. The total amplification that occurs in the back end is a function of the number and/or identity of the members of the plurality of amplifiers that are included in the signal path for any particular state of the switches. The total amplification of the programmable gain amplifier is the combination of the amplification of the front end and the back end. Either of these segments may have an amplification that is less than or greater than one.

The programmable gain amplifier is optionally configured to provide an amplified signal to an analog to digital converter. For example, some embodiments include control logic configured to program (e.g., by setting switches of the front end and/or back end) the programmable gain amplifier to amplify the signal such that it is matched to the dynamic range of the analog to digital converter.

Figure 1:
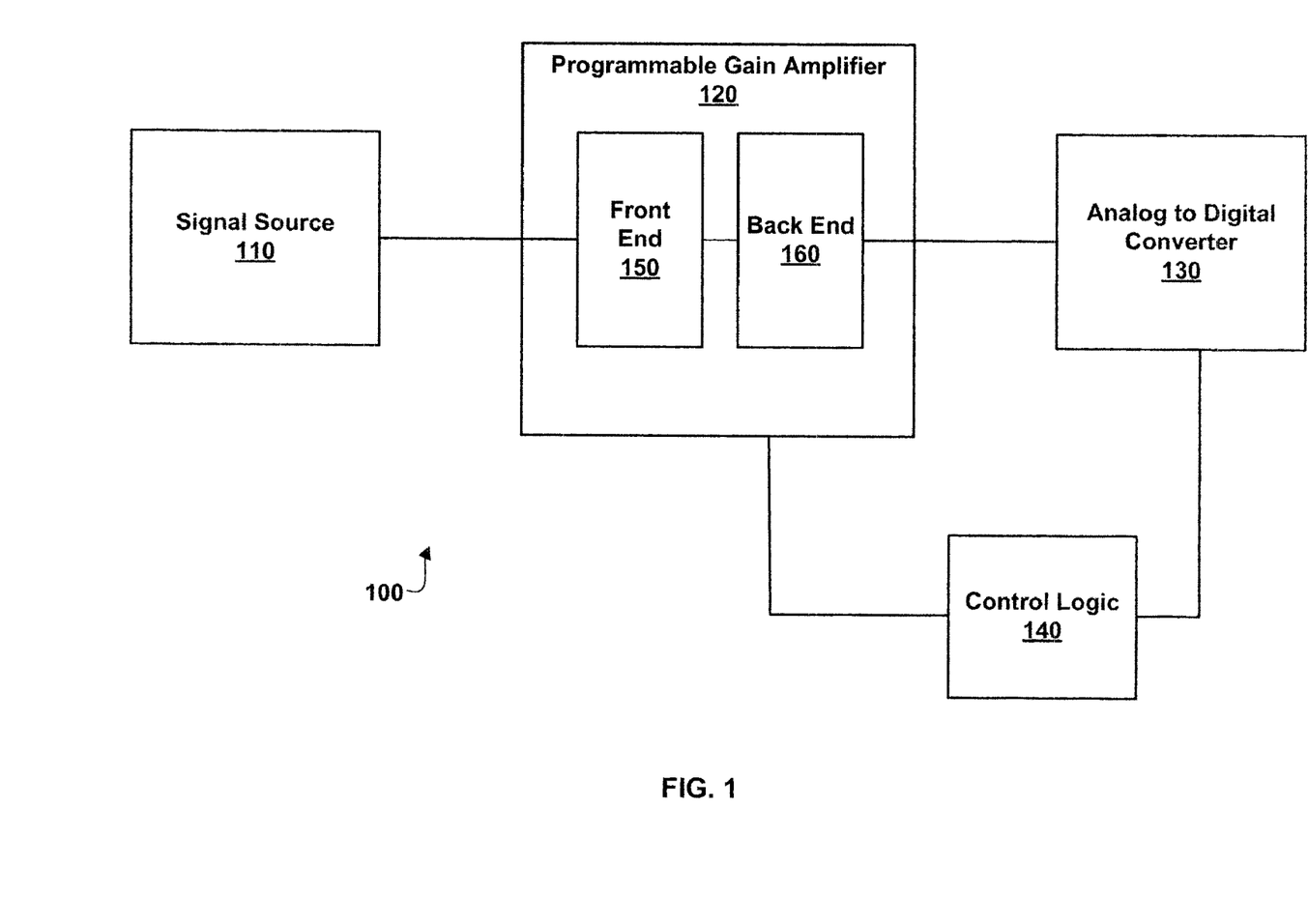
FIG. 1 illustrates a signal processing system, according to various embodiments of the invention.

FIG. 1 illustrates a Signal Processing System 100, according to various embodiments of the invention. Signal Processing System 100 includes a Signal Source 110, a Programmable Gain Amplifier 120, an Analog to Digital Converter 130, and a Control Logic 140. Signal Source 110 may include, for example, an antenna, a communication cable connector, a sensor, an optical coupler, a transducer, a coaxial cable connector, a telephone cable connector, or the like. For example, in some embodiments Signal Source 110 comprises an interface configured to receive a digitally encoded signal from a power line communication system in which data and electrical power are transmitted over the same conductors. An example of such an interface is provided in the U.S. patent applications cited elsewhere herein. Signal Source 110 is configured to provide a signal in the form of a current or voltage to Programmable Gain Amplifier 120. This current or voltage may be differential or single-ended. The signal optionally includes digitally encoded data.

Programmable Gain Amplifier 120 is optionally configured to receive the signal from Signal Source 110 and to amplify the signal. This amplification may include raising or lowering the amplitude of the signal. For example, if the amplification ratio is greater than one, the amplitude will be increased. Likewise if the amplification ratio is less than one, the amplitude of the signal will be decreased. Programmable Gain Amplifier 120 is optionally further configured to provide the amplified signal to Analog to Digital Converter 130.

Analog to Digital Converter 130 is configured to generate a digital value representative of the amplified signal. For example, Analog to Digital Converter 130 may include an 8-bit analog to digital converter configured to generate an 8-bit representation of the amplified signal. Analog to Digital Converter 130 is typically characterized by an input voltage range, a data size (e.g., 8-bit, 16-bit, 24-bit, 32-bit, etc.), a bandwidth, and/or the like. The input voltage range is the range of voltages that correspond to the range in digital output values. For example, if Analog to Digital Converter 130 is characterized by an input voltage range of 0 to 1 Volt, then (in an 8-bit data size) 0 bits on will represent approximately 0 Volts and all 8 bits on will represent approximately 1 Volt. In various embodiments, a wide range of input voltage ranges, including positive and/or negative voltages, is possible.

Programmable Gain Amplifier 120 is optionally programmed to generate a signal within the input voltage range of Analog to Digital Converter 130. This programming is performed using Control Logic 140 and includes setting switches within Programmable Gain Amplifier 120. Control Logic 140 includes, for example, hardware, software or firmware configured to set these switches. Control Logic 140 is typically responsive to a magnitude of the signal as detected within Programmable Gain Amplifier 120, Analog to Digital Converter 130, or in other circuits. For example, the digital representation generated by Analog to Digital Converter 130 may be provided to Control Logic 140 wherein the digital representation is processed to determine if switches should be changed.

Control Logic 140 is optionally configured to separately control switches in a Front End 150 and a Back End 160 of Programmable Gain Amplifier 120. For example, Control Logic 140 may be configured to determine an amount of amplification that occurs in each of the Front End 150 and the Back End 160 so as to optimize both signal to noise and linearity of the amplification process. In some embodiments, Control Logic 140 is configured to set switches to achieve the best linearity possible while still maintaining a signal to noise requirement. In some embodiments, Control Logic 140 is configured to set switches to achieve the best signal to noise while maintaining a linearity requirement. In some embodiments, Control Logic 140 is configured to receive information regarding the signal to noise of the signal and change switches accordingly. For example, the output of Analog to Digital Converter 130 may be processed to identify messages encoded there in. When this processing results in uninterpretable data, information indicating that an improved signal to noise may be needed is sent to Control Logic 140. Control Logic 140 may then change switches accordingly.

Front End 150 comprises a plurality of circuits in parallel. These circuits are alternatively selectable to be within a signal path from an input of the Front End 150 to an output of the Front End 150. Typically, only one of these circuits will be in the signal path at a time. These circuits may include amplifiers, followers, or the like. For example, in various embodiments these circuits include a plurality of transconductors. Transconductors are circuits configured to receive a voltage and generate a current proportional to the received voltage. Transconductors are characterized by a transconductance (g) which is a ratio of current at an output to a voltage at an input. Transconductance can be represented by the formula $g=I/V$, or in a differential mode $g=\Delta I/\Delta V$. Typically, each transconductor within Front End 150 is characterized by a different transconductance. The transconductors may also be characterized by different input ranges. For example, one transconductor may be configured to receive signals between 0 and 1 Volt while another of the transconductors is configured to receive signals between 0 and 4 Volts. Optionally the transconductance of these circuits is approximately proportional to the size of the input ranges for which they are optimized. For example, the transconductance of the transconductor having a 0-4 Volt range may be ¼ the transconductance of the transconductor having a 0-1 Volt range. As a result the currents they generate over their input ranges will be approximately the same. Front End 150 may be configured in a differential mode or a single-ended mode.

The output of Front End 150 is received by Back End 160. For example, where Front End 150 comprises a set of transconductors in parallel, Back End 160 is configured to receive the current generated by a selected member of the transconductors. Back End 160 comprises a plurality of selectable current-mode gain stages. These current mode gain stages are each configured to receive a current and generate a proportional output current. The ratio of the input current to the output current is referred to herein as the gain. When the output current is greater than the input current the gain is greater than one.

The gain of the Back End 160 is the product of the gain of each of the current-mode gain stages. The gain of the Back End 160 is programmable by selecting which of the current mode gain stages are included in a signal path between an input of the Back End 160 and an output of the Back End 160. This selection is typically made by setting switches included in Back End 160. The current gain stages may have gains less than, equal to, or greater than one.

The Back End 160 may be configured in a differential and/or single-end configuration. For example, each of the current mode gain stages may be differential or single-ended. If Front End 150 is configured in a differential mode, Back End 160 may comprise a series differential mode current gain stages, or two parallel series of single-end current gain stages. In some embodiments Back End 160 comprises a mixture of differential and single-end current gain stages.

Back End 160 optionally further comprises a current to voltage converter configured to convert a current output of a final current gain stage from a current to a voltage. This current to voltage converter optionally includes a resistor to ground or a resistor between differential outputs.

As discussed elsewhere herein, Programmable Gain Amplifier 120 is programmable to generate an output that matches the input range of Analog to Digital Converter 130. In selecting a total gain of Programmable Gain Amplifier 120 gross steps in gain (and, thus, amplification) are typically made using Front End 150 and fine steps in gain are made using Back End 160. For example, in some embodiments the differences in transconductance of transconductors within Front End 150 are on the order of 18 dB while the difference in gain of Back End 160 that can be achieved by setting switches to include various members of the current gain stages in the signal path are on the order of 6 dB or less. A gross step is defined as a step that is larger than a fine step. The fine steps may be less than ½, ⅓, ¼, ⅕ or 1/7 of the gross steps.

Figure 2:
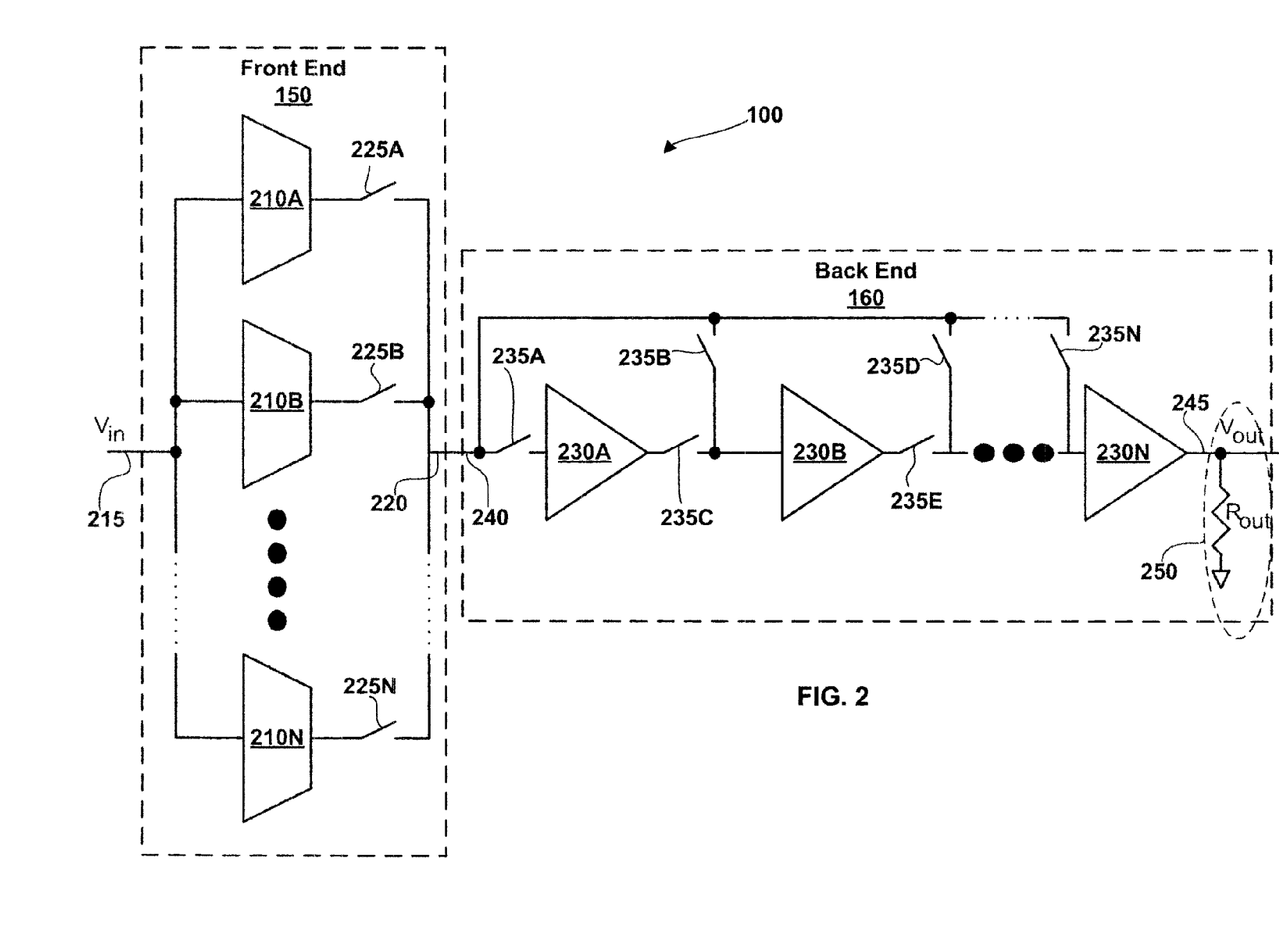
FIG. 2 illustrates a programmable gain amplifier comprising a front end and a back end, according to various embodiments of the invention.

FIG. 2 illustrates further details of Programmable Gain Amplifier 120 comprising a Front End 150 and a Back End 160, according to various embodiments of the invention. In these embodiments, Front End 150 comprises a plurality of Transconductors 210, individually labeled 210A, 210B . . . 210N. Transconductors 210 may be placed, one at a time, in a signal path between an Input 215 and an Output 220 of Front End 150. This placement is controlled by Switches 225, individually labeled 225A, 225B . . . 225N. Front End 150 may comprise 2, 3, 4 or more Transconductors 210 and Switches 225. Typically only one of Switches 225 is closed at once. For example, to include Transconductor 210B in the signal path Switch 225B is closed and the other Switches 225 are opened. In alternative embodiments, Switches 225 are disposed between Input 215 and Transconductors 210 rather than between Output 220 and Transconductors 210 as shown.

In some embodiments, the transconductance of each of Transconductors 210 differs by a similar amount. For example, in various embodiments the transconductances differ by 12 dB, 18 dB, 24 dB, or 30 dB dB. The transconductances may include values less than, equal to, and greater than one. Typically, each of Transconductors 210 is optimized to receive signals of a specific voltage range and to introduce a minimal amount of noise into the signal at this voltage range. Transconductors 210 optionally also differ in their frequency response or include a tunable frequency response.

In the embodiments illustrated in FIG. 2 Back End 160 comprises a plurality of Current Gain Stages 230, individually labeled 230A, 230B . . . 230N. Switches 235 are used to control which of Current Gain Stages 230 are included in a signal path between an Input 240 and an Output 245 of Back End 160. Back End 160 may comprise 1, 2, 3, 4 or more (n) Current Gain Stages. One, two or more of Current Gain Stages 230 may be included in the signal path at the same time. For example, if Switches 235B, and 235E are closed while Switches 235A, 235C, 235D . . . and 235N are open, then Current Gain Stages 230B . . . 230N, but not 230A will be included in the signal path.

Current Gain Stages 230 may have the same or different gain ratios. For example, in some embodiments, each of Current Gain Stages 230 has a gain of 6 dB. In some embodiments, some members of Current Gain Stages 230 have a gain of 6 dB while other members have a gain of 3 dB. Other gains are included in alternative embodiments, however, in most embodiments the gains of the Current Gain Stages 230 are smaller than the differences in transconductance between Transconductors 210. For example, if the difference in transconductances is 18 dB, the gain of Current Gain Stages 230 may be 3, 6, and/or 9 dB.

In some embodiments, a last of the Current Gain Stages 230, e.g., Current Gain Stage 230N is configured such that it is always included in the signal path. See FIG. 2. In these embodiments, this last Current Gain Stage 230N is configured to provide the output of Back End 160. For example, Current Gain Stage 230N may be configured to provide a current suitable for conversion to a voltage within the voltage input range of Analog to Digital Converter 130. By always including Current Gain Stage 230N in the signal path, output characteristics such as capacitive load, output impedance, and inductance may be held constant as the gain of Back End 160 is varied.

Back End 160 optionally further comprises a Conversion Circuit 250 configured to convert the current output of Current Gain Stage 230N to a voltage. Conversion Circuit 250 may include a resistor ($R_{out}$) as illustrated in FIG. 2. Other current to voltage circuits may be found in alternative embodiments.

Figure 3:
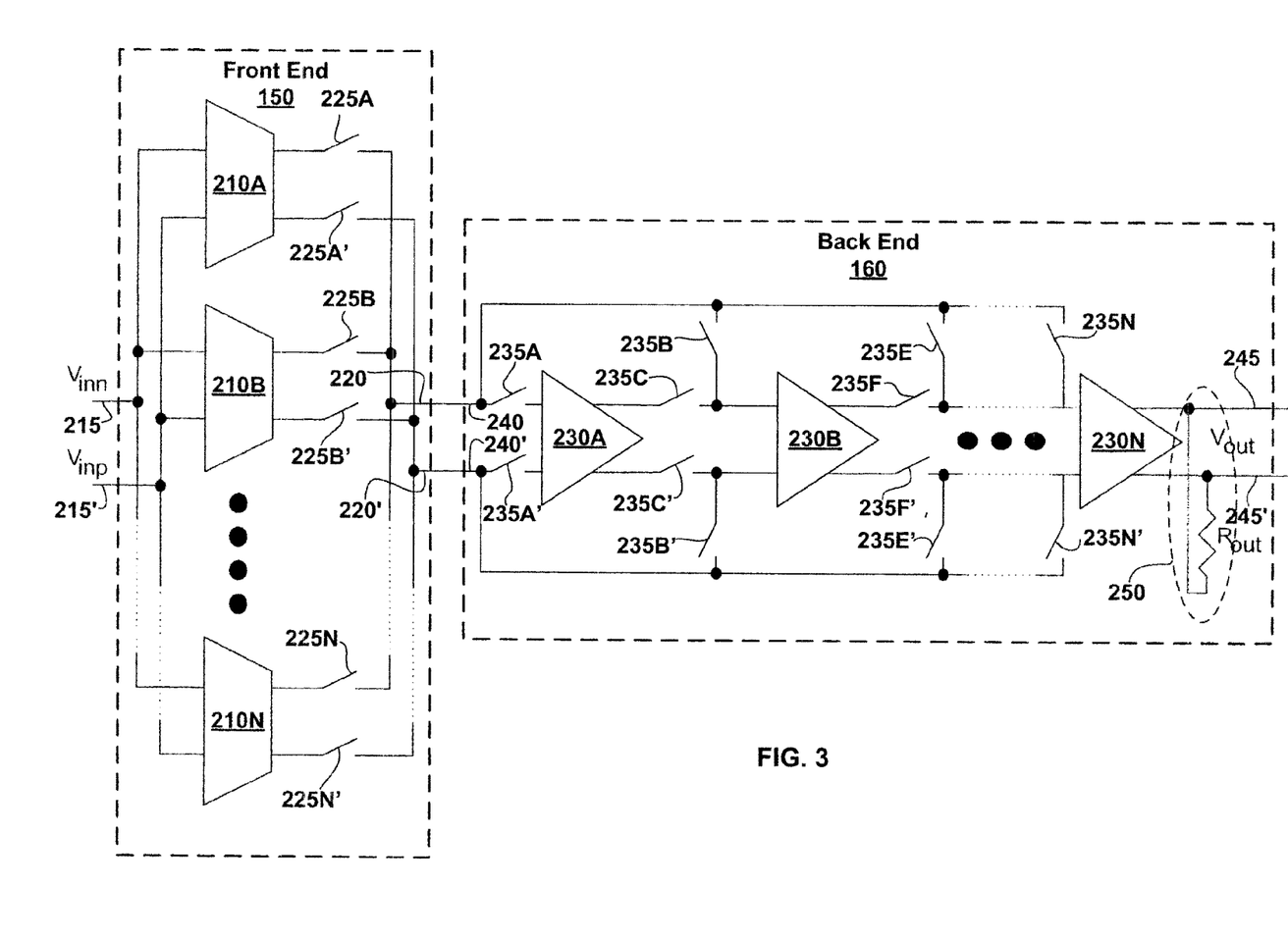
FIG. 3 illustrates a programmable gain amplifier comprising a differential mode front end and a differential mode back end, according to various embodiments of the invention.

The embodiments of Transconductors 210 and Current Gain Stages 230 illustrated in FIG. 2 are single-ended. However, in alternative embodiments, Transconductors 210 and/or Current Gain Stages 230 may be differential. FIG. 3 illustrates Programmable Gain Amplifier 120 comprising a differential mode Front End 150 and a differential mode Back End 160, according to various embodiments of the invention.

In the differential mode Transconductors 210 generate two currents as output. The difference between these currents is proportional to the difference between two voltage inputs. Switches 225 are replaced by pairs of switches, labeled 225 and 225'. Likewise Switches 235 are replaced by pairs of switches, labeled 235 and 235'. In the differential mode Current Gain Stages 230 generate two output currents whose difference is proportional to a difference between two input currents. Conversion Circuit 250 optionally comprises a resistor disposed between the outputs of the final Current Gain Stage 230N.

In various alternative embodiments Front End 150 is differential while Back End 160 is single-ended, or Front End 150 is single-ended while Back End 160 is differential.

Figure 4A:
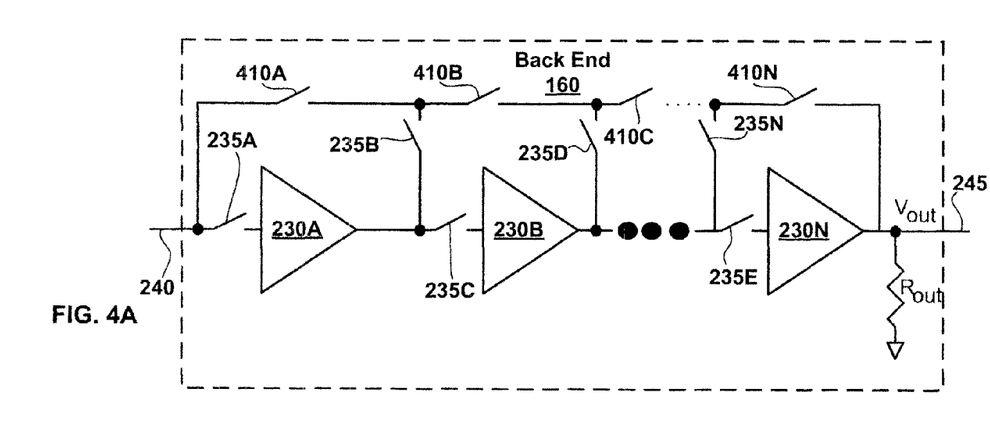
FIGS. 4A and 4B illustrate alternative embodiments of a back end, according to various embodiments of the invention.
Figure 4B:
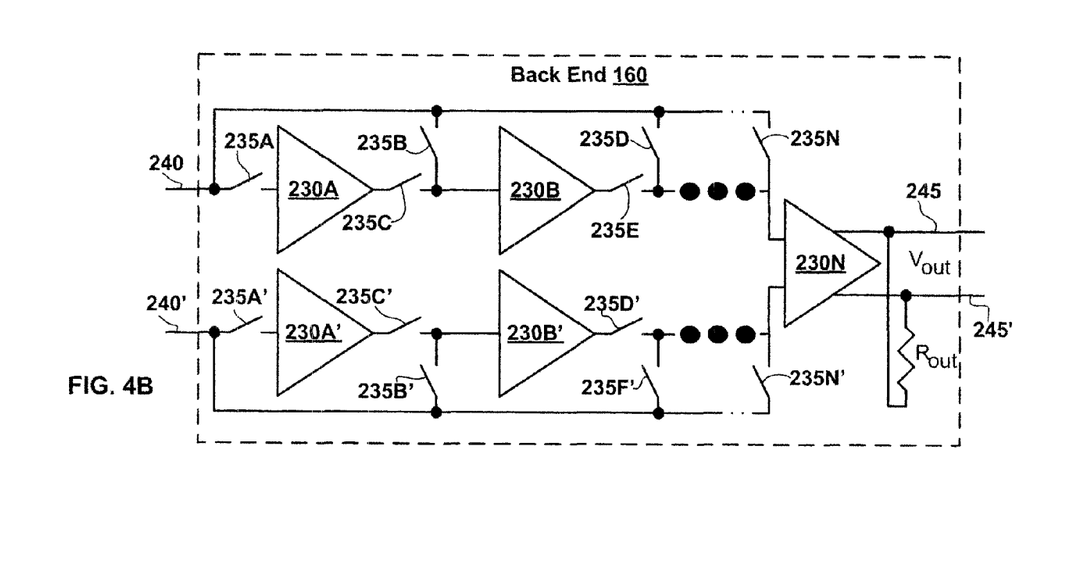

FIGS. 4A and 4B illustrate alternative embodiments of Back End 160, according to various embodiments of the invention. In FIG. 4A additional Switches 410 are configured to allow for further control of which members of Current Gain Stages 230 are included in the signal path. The embodiments of Back End 160 illustrated in FIG. 2 allow for exclusion of Current Gain Stages 230 starting at 230A by closing Switch 235B and closing a Switch 410A, and next excluding Current Gains Stages 230A and 230B by closing Switch 235D and a Switch 410B. This exclusion from the left to right (as illustrated) can be stepped through Back End 160 by closing successive switches until only Current Gain Stage 230N is included in the signal path. The embodiments illustrated in FIG. 4A further allow for exclusion of Current Gain Stages 230 without necessarily starting at one end of Back End 160. For example, closing of Switches 410A, 235B, and 235C result in the inclusion of Current Gain Stage 230A and inclusion of Current Gain Stage 230B. Switches 410A, 410C . . . 410N may likewise be used to exclude individual Current Gain Stages 230. Addition of further switches to the embodiments illustrated in FIG. 2 would allow stepwise exclusion of Current Gain Stages 230 from either the left to the right or the right to the left.

FIG. 4B illustrates embodiments of Back End 160 in which some of Current Gain Stages 230 are single-ended while others of Current Gain Stages 230 are differential. Specifically, Current Gain Stages 230A, 230B, etc. and 230A', 230B', etc. are single-ended while Current Gain Stage 230N is differential. While the example illustrated shows the last Current Gain Stage 230N as being differential, other combinations of differential and single-ended Current Gain Stages 230 may be included in alternative embodiments.

Figure 5A:
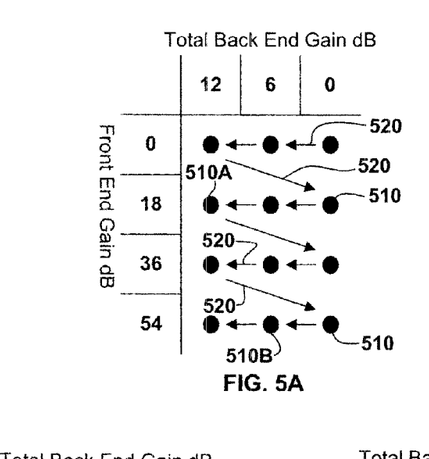
FIGS. 5A through 5C each illustrate a matrix of programmable gains possible using the front end and the back end, according to various embodiments of the invention.
Figure 5B:
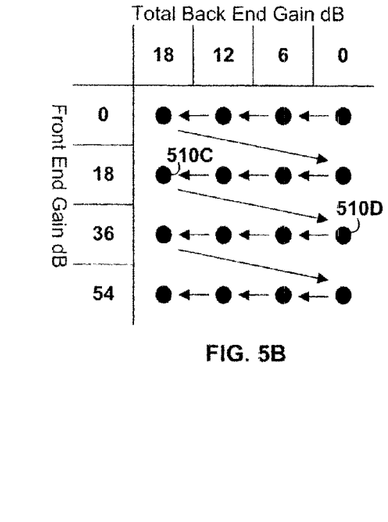
Figure 5C:
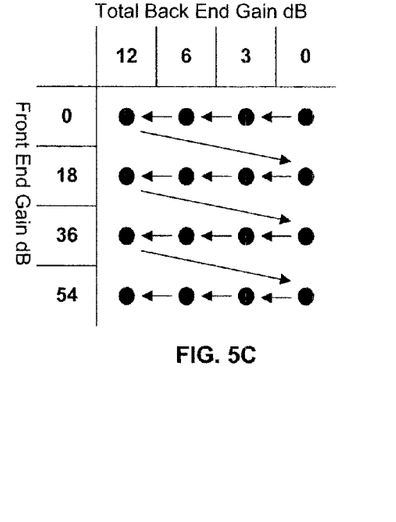

FIGS. 5A through 5C each illustrate a matrix of programmable gains possible using the front end and the back end, according to various embodiments of the invention. These matrixes illustrate how various combinations of front end gain and back end gain can be used together to produce a total gain of Programmable Gain Amplifier 120. For example, FIG. 5A shows three possible total gain contributions (0 dB, 6 dB and 12 dB) for Back End 160. In various embodiments, these values may be achieved by opening and closing Switches 235 to include and exclude Current Gain Stages 230 from the signal path. Specifically, these values could be obtained if Current Gain Stage 230N had a current gain of 0 dB, Current Gain Stage 230B had a current gain of 6 dB and Current Gain Stage 230A had a current gain of 6 dB. FIG. 5A also shows four possible gain contributions (0 dB, 18 dB, 36 dB, 54 dB) contributed by Front End 150. These values can be obtained if Transconductor 210A contributes 0 dB to the total of gain to Programmable Gain Amplifier 120, Transconductor 210B contributes 18 dB of the total gain, Transconductor 210C (not shown) contributes 36 dB of the total gain, and Transconductor 210N contributes 54 dB of the total gain.

The total gain of Programmable Gain Amplifier 120 may be stepped between different Gain States 510 as illustrated by the Arrows 520 shown in FIG. 5A. For example, gain may be changed in steps of 6 dB by following the path of Arrows 520. If required, transitions between gain states may take other paths. For example Programmable Gain Amplifier 120 may be changed from a Gain State 510A that includes 12 dB back end gain and 18 front end gain to a Gain State 510B that includes 6 dB back end gain and 54 front end gain.

FIG. 5B illustrates embodiments in which the programmable gains that can be achieved by changing the gain contributed by Back End 160 overlap with the gains that can be achieved by changing the gain of Front End 150. For example, a Gain State 510C and a Gain State 510D both provide approximately a total of 36 dB gain. Such overlapping gains may be advantageous when changing gain contribution in one of Front End 150 and Back End 160 is easier or creates less noise that changing the other.

FIG. 5C illustrates embodiments in which gain steps within Back End 160 differ in magnitude. For example, the gain contributions of (0 dB, 3 dB, 6 dB, 12 dB) shown may be achieved by having Current Gain Stage 230A contribute 6 dB, Current Gain Stage 230B contribute 3 dB, and Current Gain Stage 230N contribute 3 dB. In some embodiments, the gain contribution steps within Front End 150 may likewise by different in magnitude.

Figure 6:
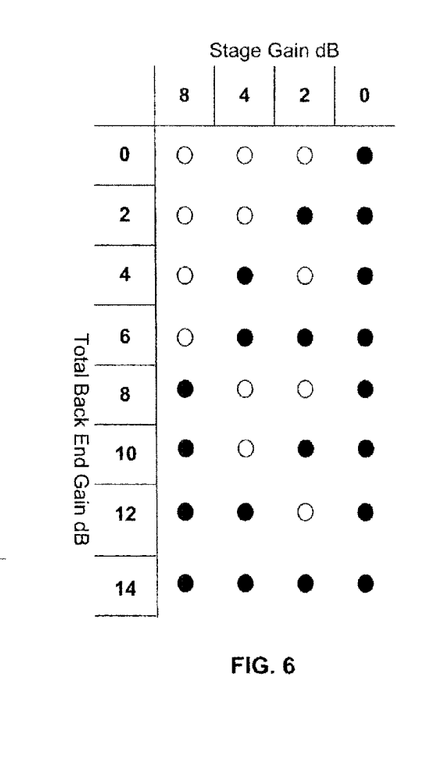
FIG. 6 illustrates various programmable gains within the back end, according to various embodiments of the invention.

FIG. 6 illustrates various programmable gain contributions within Back End 160, according to various embodiments of the invention. The x-axis represents the gains (8, 4, 2, and 0 dB) of four different Current Gain Stages 230. By including the appropriate Current Gain Stages 230 within the signal path, total gain contributions of Back End 160 may be selected from 0, 2, 4, . . . , 12, and 14 dB. The optional gain stage having 0 dB may or may not be included in each of the selections. The programmable gains illustrated in FIG. 6 may be achieved using a configuration such as that illustrated in FIG. 4A, where each of Current Gain Stages 230 can be independently selected for inclusion or exclusion in the signal path. In FIG. 6 open circles represent a Current Gain Stage 230 that is excluded from the signal path and black circles represent a Current Gain Stage 230 that is included in the signal path.

Figure 7:
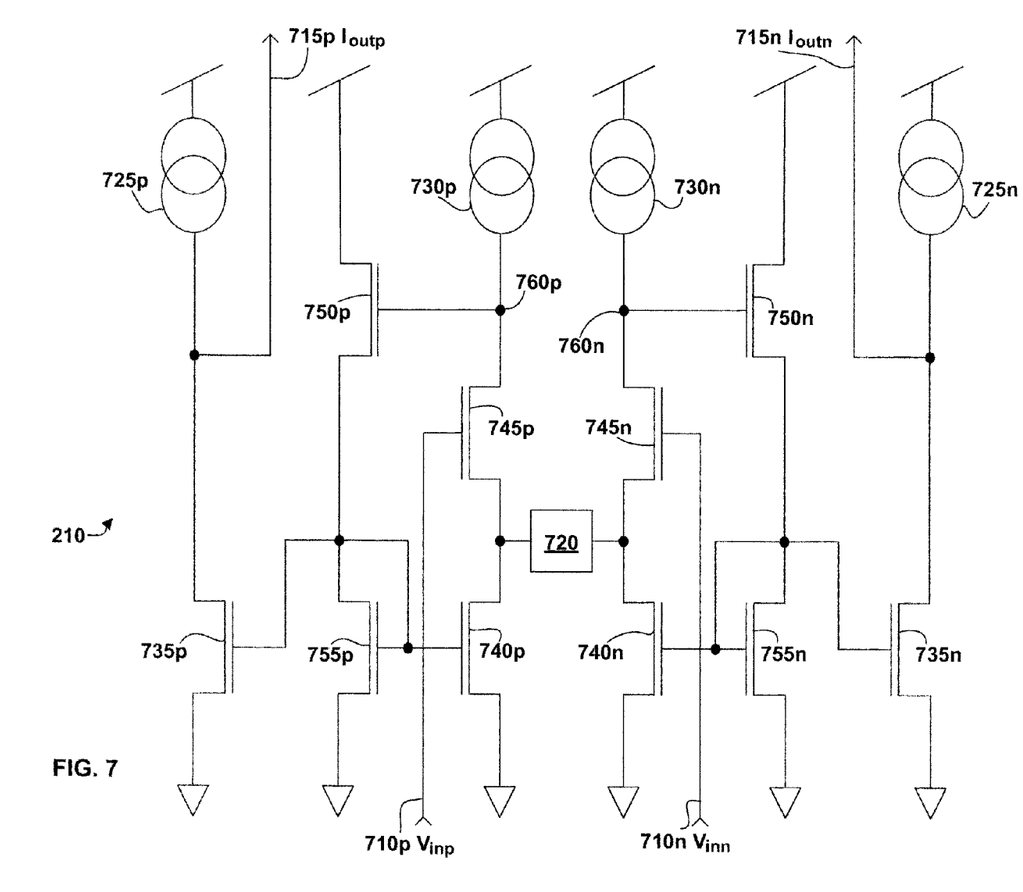
FIG. 7 illustrates a transconductor, according to various embodiments of the invention.

FIG. 7 illustrates an example of Transconductor 210, according to various embodiments of the invention. This example includes a differential transconductor comprising two Voltage Inputs 710$p$ and 710$n$ configured to receive voltages $V_{inp}$ and $V_{inn}$, respectively, and two Current Outputs 715$p$ and 715$n$ through which currents $I_{outn}$ and $I_{outp}$ are provided, respectively. The difference between the current outputs is proportional to the difference between the voltage inputs. Briefly, this embodiment of Transconductor 210 operates by copying the voltage difference between $V_{inp}$ and $V_{inn}$ across a Resistor 720 having resistance R. As a result of this voltage difference, a current $I_R=(V_{inp}-V_{inn})/R$ flows across Resistor 720. This current results in a difference between the output currents $I_{outn}$ and $I_{outp}$. The transconductance of Transconductor 210 is determined by, for example, a value of the resistance R and the ratio of current sources discussed elsewhere herein.

More specifically, the embodiments of Transconductor 210 illustrated in FIG. 7 are optionally operated as follows. The Transconductor 210 is biased by setting Current Sources 725$p$, 725$n$, 730$p$ and 730$n$ such that the currents provided by 725$p$ and 725$n$ are equal, and the currents provided by 730$p$ and 730$n$ are equal. In addition the following relation is held $I_{725p}/I_{730p}=(W_{735p}/L_{735p})/(W_{740p}/L_{740p})$, where $I_{725p}$ is the current provided by Current Source 725$p$, $I_{730p}$ is the current provided by Current Source 725$p$, $W_{735p}$ and $L_{735p}$ are the width and length of a Transistor 735$p$, and $W_{740p}$ and $L_{740p}$ are the width and length of a Transistor 740$p$. The Transconductor 210 is symmetric in the sizes of transistors on either side of Resistor 720. As such, Transistors 735$n$ and 740$n$ are governed by the same relationship.

Transistors 745$p$ and 745$n$ are configured to operate as source followers and as such copy the voltages $V_{inp}$ and $V_{inn}$ minus a constant voltage to their sources, which are disposed on either side of Resistor 720. Because the gate-source voltage is the same for Transistors 745$p$ and 745$n$, the difference in voltages at the sources of these transistors is the same as the difference in voltages at their gates. As a result, an excess current $(V_{inp}-V_{inn})/R$ flows across Resistor 720. This excess current must flow through Transistor 740$p$, and a current of the same magnitude but opposite sign (polarity) flows through Transistor 740$n$. These currents are generated by two local gain loops. The first of these loops comprises a Transistor 750$p$, a Transistor 755$p$, Transistor 740$p$ and Transistor 745$p$. The second of these loops comprises a Transistor 750$n$, a Transistor 755$n$, Transistor 740$n$ and Transistor 745$n$. Nodes 760$p$ and 760$n$ are high-impedance nodes which amplify any variation of voltage on the sources of Transistors 745$p$ and 745$n$, respectively. The voltages at Nodes 760$p$ and 760$n$ are converted to currents by Transistors 750$p$ and 750$n$. These currents are fed back by a current mirror comprising Transistors 755$p$ and 740$p$, and a current mirror comprising Transistors 755$n$ and 740$n$. As a result of this negative feedback the input voltage difference $V_{inp}-V_{inn}$ is copied across Resistor 720.

Because Transistors 735$p$ and 740$p$ have the same gate-source voltage the ratio of their drain currents is $I_{drain735p}/I_{drain740p}=I_{725p}/I_{730p}$. Using Kirchhoff's Current Law the current $I_{725p}=I_{outp}+I_{drain735p}$ and the current $I_{730p}=I_R+I_{drain740p}$. Solving these equations yields that the current $|I_{outn}|$ must equal the current $I_R$ through Resistor 720. A similar set of relations hold for the other side of Transconductor 210. Note, however, that $I_{outp}=-I_{outn}$. The transfer function of Transconductor 210 illustrated in FIG. 7 is $I_{outp}-I_{outn}=2(V_{inn}-V_{inp})/R$.

Figure 8:
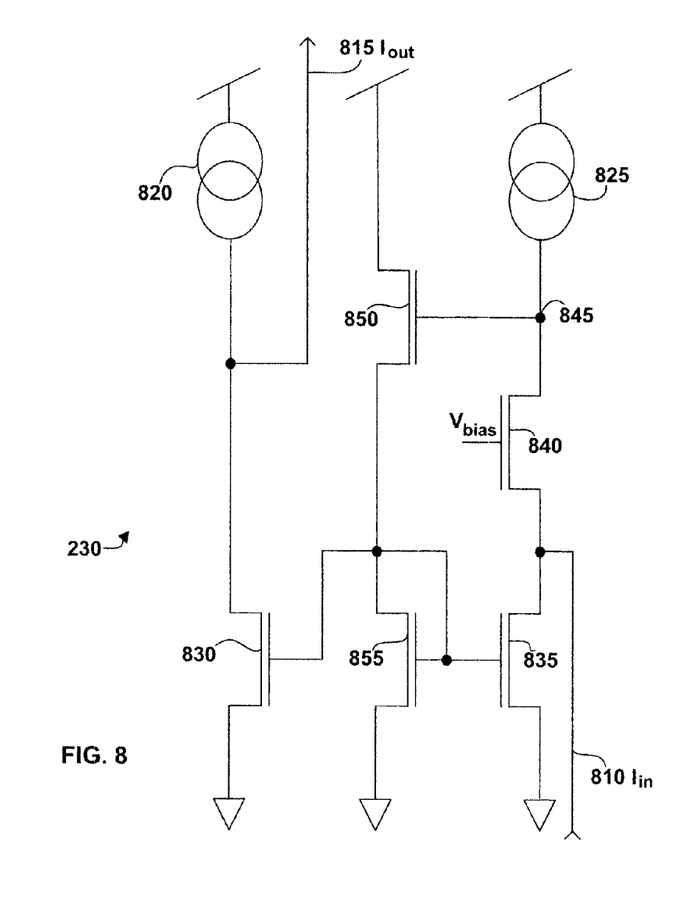
FIG. 8 illustrates a current-mode gain stage, according to various embodiments of the invention.

FIG. 8 illustrates an example of a Current Gain Stage 230, according to various embodiments of the invention. This example is single sided and comprises one Current Input 810 and one Current Output 815. This circuit operates on the same local gain loop principle as the circuit illustrated in FIG. 7.

More specifically, a Current Source 820 and a Current Source 825 are biased such that their respective currents $I_{820}$ and $I_{825}$ are related by $I_{820}/I_{825}=(W_{830}/L_{830})/(W_{835}/L_{835})$, where $W_{830}$ and $L_{830}$ are the width and length of a Transistor 820, and $W_{835}$ and $L_{835}$ are the width and length of a Transistor 835. The ratio $I_{820}/I_{825}$ is also equal to the current gain of the circuit. A Transistor 840 is a common-gate input with a fixed gate bias $V_{bias}$. A Node 845 is a high-impedance node configured to amplify any variation of voltage on the source of Transistor 840. The voltage at Node 845 is converted into a current by a Transistor 850 and fed back to the Current Input 810 using a current mirror comprising a Transistor 855 and a Transistor 835. As a result of this negative feedback loop, the voltage on the source of Transistor 840 is kept essentially constant for the range of possible currents provided through Current Input 810. A fixed bias current $I_{825}$ therefore flows through Transistor 840. The drain current through Transistor 835 is therefore the sum of the current $I_{825}$ and the input current provided through Current Input 810. As Transistors 835 and 830 have the same gate-source voltage, their drain currents ($I_{drain835}$ and $I_{drain830}$ respectively) have the relationship $I_{drain830}=(W_{830}/L_{830})/(W_{835}/L_{835})*I_{drain835}$ or expressed in terms of the gain, $I_{drain830}=gain*I_{drain835}$.

Again, applying Kirchhoff's Current Law one derives that $I_{815}=\text{gain}*I_{810}$, which is the transfer function for the illustrated circuit.

Figure 9:
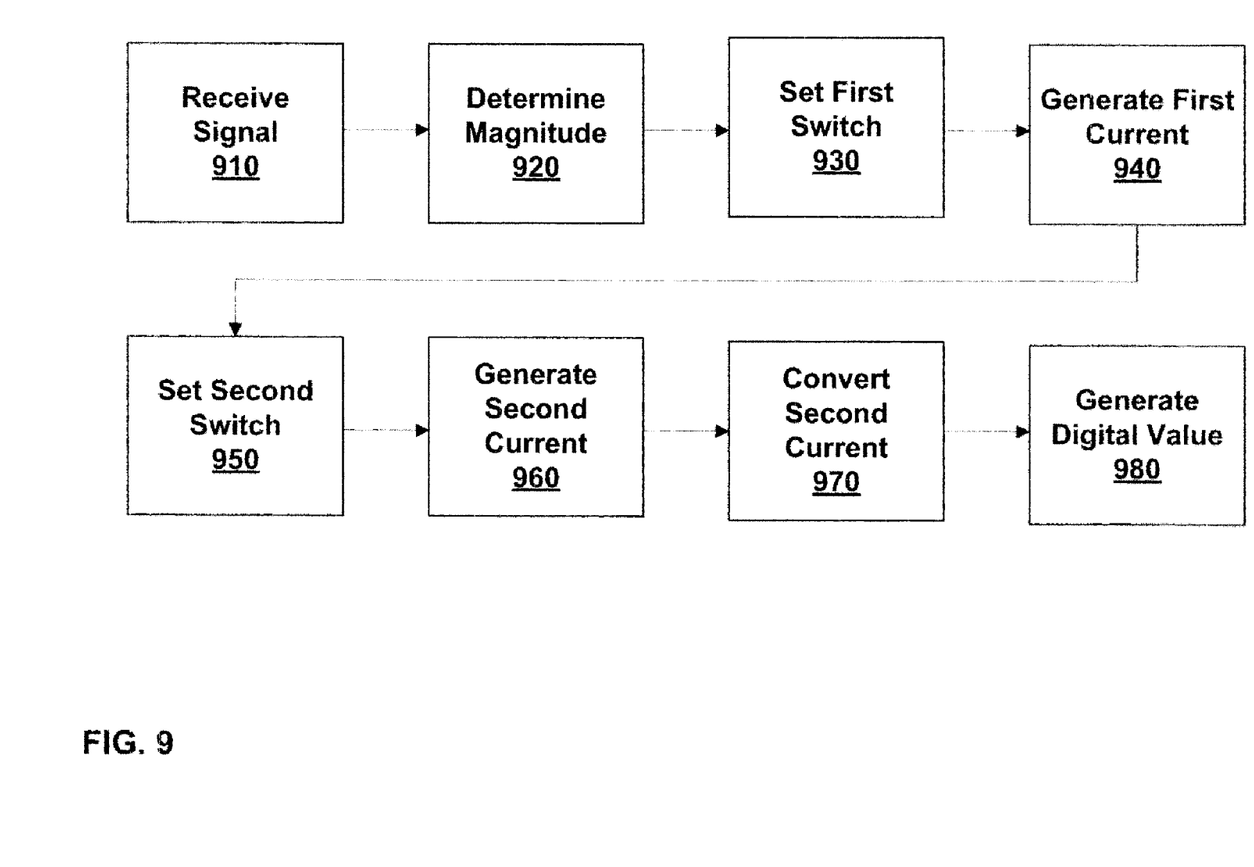
FIG. 9 illustrates a method of processing a signal, according to various embodiments of the invention.

FIG. 9 illustrates a method of processing a signal, according to various embodiments of the invention. In this method the configuration of Programmable Gain Amplifier 120 is programmed to produce a selected gain. This selection may be made such that an amplified signal matches the input characteristics of a subsequent circuit. This subsequent circuit optionally includes Analog to Digital Converter 130.

In a Receive Signal Step 910, a signal is received, for example using Signal Source 110. The received signal may be in a known (predictable) or unknown (unpredictable) range. For example, if the signal is received via an antenna, variable length conductor, or the like the signal may be attenuated by an unpredictable amount before it is received. The received signal optionally comprises digitally encoded data. The received signal may be represented by a voltage or a current.

In an optional Determine Magnitude Step 920, information about the magnitude of the signal is determined. This information may include that the signal is below, within and/or above a voltage or current range. Determine Magnitude Step 920 may include applying the signal to a comparator, digitizing the signal, or making some other measurement of the signal. Determine Magnitude Step 920 may occur at any time in the method illustrated in FIG. 9, including after the last step illustrated.

In a Set First Switch Step 930, one or more Switches 225 within Front End 150 are set to select a single one of Transconductors 210 to be included in the signal path of Front End 150. The set Switches 225 may be set to a default setting or to a setting in response to the information determined in Determine Magnitude Step 920. For example, if the information includes that the signal is represented by a voltage greater than an optimal input voltage range of Transconductor 210A, then Switches 225 may be set for Transconductor 210B (or some other appropriate member of Transconductors 210) to be included within the signal path of Front End 150. The setting of Switches 225 will result in a current path that includes one but not others of Transconductors 210. Set First Switch Step 930 is optionally performed using Control Logic 140.

In a Generate First Current Step 940, a first current is generated using the selected single one of Transconductors 210 selected in Set First Switch Step 930. This current is typically related to the magnitude of the received signal. For example, the generated current may be proportional to a received voltage, the proportionality constant being approximately the transconductance of the single selected one of Transconductors 210. The magnitude of the generated current is dependent on which of the Transconductors 210 was selected using Switches 225. The generated current is provided to the Output 220 of Front End 150.

In a Set Second Switch Step 950, one or more Switches 235 within Back End 160 are set to select which of Current Gain Stages 230 are included in the signal path within Back End 160 and, thus, select a gain of Back End 160. The set Switches 235 may be set to a default setting or a setting in response to the information determined in Determine Magnitude Step 920. FIGS. 5A-5C and 6 illustrate some possible gain states of Front End 150 and Back End 160. Optionally, the gain of Back End 160 is selected to adjust the output of Front End 150 to better match input characteristics of subsequent circuits. For example, the gain of Back End 160 may be selected to match an input range of Analog to Digital Converter 130. The setting of Switches 235 may result in a signal path that includes all of the Current Gain Stages 230, in a signal path that includes one or more of Current Gain Stages 230 but not others of Current Gain Stages 230, or a current path that includes none of Current Gain Stages 230. Set Second Switch Step 950 is optionally performed using Control Logic 140.

In a Generate Second Current Step 960, Back End 160 is used to generate a second current proportional to the current generated using Front End 150 in Generate First Current Step 940. This current may be generated by passing the output of Front End 150 through some but not others of Current Gain Stages 230.

In an optional Convert Second Current Step 970, the current generated in Generate Second Current Step 960 is converted to a voltage using Conversion Circuit 250. This optionally includes passing the current through a resistor.

In an optional Generate Digital Value Step 980, the signal received via Front End 150 and Back End 160 is converted to a digital value, for example using Analog to Digital Converter 130. This digital value may be 8-bit, 16-bit, 24-bit, 32-bit, 64-bit or some other data size. The digital value is optionally provided to Control Logic 140. Control Logic 140 may use this value as feedback to set Switches 225 or Switches 235.

The order of steps illustrated in FIG. 9 may be different in other embodiments. For example, in some embodiments Set First Switch Step 930 and Set Second Switch Step 950 are performed in parallel or subsequent to each other. Likewise, if Switches 225 and 235 are initially set to default values, then these steps may occur for the first time before a signal is received. The method illustrated in FIG. 9 may be repeated. For example, during reception of a signal, if the intensity range of the signal varies, then Programmable Gain Amplifier 120 may be reprogrammed dynamically. Further, the method may be performed repeatedly in an iterative process until switch settings appropriate to the received signal are found.

In some embodiments, by separately selecting those elements of Front End 150 and Back End 160 through which the signal passes, both signal to noise and linearity may be optimized. Each total gain state of Programmable Gain Amplifier 120 can be optimized with no or minimal trade-off between linearity and signal to noise. For example, for a large input signal linearity is typically more critical than low noise. For these signals a relatively low transconductance, e.g., Transconductor 210A, is selected in Front End 150. For smaller input signals, a larger input transconductance, e.g., Transconductor 210N, is used in Front End 150 and more of the total gain is applied in Front End 150. This tends to minimize noise.

Several embodiments are specifically illustrated and/or described herein. However, it will be appreciated that modifications and variations are covered by the above teachings and within the scope of the appended claims without departing from the spirit and intended scope thereof. For example, while the embodiments discussed herein comprise a back end in which amplification occurs in a current mode, in alternative embodiments the front end is configured to output a voltage and the back end is configured to amplify in a voltage mode. While the Programmable Gain Amplifier 120 is described herein as being used to amplify a signal prior to being received by Analog to Digital Converter 130, the Programmable Gain Amplifier 120 may be used in other applications wherein programmable amplifiers are used. In some embodiments, a variable amplifier is included in the front end and/or back end. The terms first and second, etc. as used as adjectives in the claims are not meant to particular physical ordering, rather they are meant merely to distinguish elements. In embodiments wherein the signal received by Programmable Gain Amplifier 120 is in a current mode, the parallel Transconductors 210 of Front End 150 may be replaced by parallel current gain stages similar to Current Gain Stages 230.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A system comprising:
    a front end comprising alternatively selectable parallel means for receiving a voltage and converting the received voltage to a current, each of the parallel means being configured to receive the voltage from a same voltage source and provide the current via a common current output coupled to each of the parallel means;
    a back end comprising serial means for variably amplifying the current, the serial means coupled to the common current output of the front end; and
    control logic configured to control a first ratio between the received voltage and the current, and a second ratio between the current and the amplified current.

2. The system of claim 1, wherein the selectable parallel means include at least three amplifiers, each of which is configured to receive signals in a different voltage range.

3. The system of claim 1, wherein each of the alternatively selectable parallel means is configured to have a different transconductance.

4. The system of claim 1, further comprising an analog to digital converter configured to receive the amplified current from the back end.

5. The system of claim 4, wherein the control logic is configured to control the first ratio responsive to an output of the analog to digital converter.

6. The system of claim 5 wherein the output of the analog to digital converter comprises a digital value.

7. The system of claim 6 wherein the digital value is an 8-bit, 16-bit, 24-bit, 32-bit, or 64-bit output.

8. The system of claim 1, further comprising a signal source, wherein the front end is configured to receive a signal comprising the voltage from the signal source.

9. The system of claim 8, wherein the control logic is configured to respond to an increase in the signal by increasing a third ratio of the first ratio to the second ratio.

10. A system comprising:
    a programmable gain amplifier including:
        a front end comprising a plurality of transconductors, each transconductor coupled in parallel between a common voltage input and a common current output by one of a plurality of switches, each switch of the plurality of switches being independently controllable, and
        a back end comprising a plurality of selectable current gain stages arranged in series and configured to receive a current from the common current output and produce a modified current; and
    control logic configured to control a first ratio between the received voltage and the current, and a second ratio between the current and the modified current.

11. The system of claim 10, wherein the plurality of transconductors includes at least three transconductors, each transconductor of which is configured to receive signals in a different voltage range.

12. The system of claim 10, wherein each transconductor of the plurality of transconductors is configured to have a different transconductance.

13. The system of claim 10 further comprising an analog to digital converter configured to receive the modified current from the programmable gain amplifier.

14. The system of claim 13 wherein the control logic is configured to control the first and second ratios responsive to an output of the analog to digital converter.

15. The system of claim 14 wherein the output of the analog to digital converter comprises a digital value.

16. The system of claim 15 wherein the digital value is 8-bit, 16-bit, 24-bit, 32-bit, or 64-bit output.

17. The system of claim 10, further comprising a signal source, wherein the common voltage input is configured to receive a voltage from the signal source.

18. The system of claim 17, wherein the logic is configured to respond to an increase in the voltage by increasing a third ratio of the first ratio to the second ratio.

* * * * *

UNITED STATES PATENT AND TRADEMARK OFFICE
CERTIFICATE OF CORRECTION

PATENT NO. : 8,089,315 B2
APPLICATION NO. : 12/869595
DATED : January 3, 2012
INVENTOR(S) : Jonathan Ephraim David Hurwitz et al.

It is certified that error appears in the above-identified patent and that said Letters Patent is hereby corrected as shown below:

Title page, Section (75) Inventors: Replace "Jonathan Ephriam David Hurwitz" with "Jonathan Ephraim David Hurwitz"

Signed and Sealed this
Twelfth Day of March, 2013

Teresa Stanek Rea
*Acting Director of the United States Patent and Trademark Office*